(12) United States Patent
Do

(10) Patent No.: US 11,023,207 B1
(45) Date of Patent: Jun. 1, 2021

(54) TRUE RANDOM NUMBER GENERATOR AND SYSTEM COMPRISING THE SAME

(71) Applicant: Agency for Science, Technology and Research, Singapore (SG)

(72) Inventor: Anh Tuan Do, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 496 days.

(21) Appl. No.: 16/074,210

(22) PCT Filed: Feb. 24, 2017

(86) PCT No.: PCT/SG2017/050083
§ 371 (c)(1),
(2) Date: Jul. 31, 2018

(87) PCT Pub. No.: WO2017/146650
PCT Pub. Date: Aug. 31, 2017

(30) Foreign Application Priority Data

Feb. 24, 2016 (SG) .......................... 10201601393W

(51) Int. Cl.
*G06F 7/58* (2006.01)
*H03K 19/21* (2006.01)

(52) U.S. Cl.
CPC ............. *G06F 7/588* (2013.01); *H03K 19/21* (2013.01)

(58) Field of Classification Search
CPC ................................ G06F 7/588; H03K 19/21
USPC ................................................ 708/250–256
See application file for complete search history.

(56) References Cited

U.S. PATENT DOCUMENTS

| 5,706,218 A | 1/1998 | Hoffman |
| 2004/0107230 A1* | 6/2004 | Bardouillet ............ H03K 3/84 708/252 |
| 2008/0183788 A1 | 7/2008 | Song et al. |
| 2008/0256153 A1 | 10/2008 | Park et al. |

(Continued)

FOREIGN PATENT DOCUMENTS

| CN | 102375722 A | 3/2012 |
| CN | 104598198 A | 5/2015 |

OTHER PUBLICATIONS

International Preliminary Report on Patentability for International Application No. PCT/SG2017/050083 dated Jan. 29, 2018, pp. 1-20.

(Continued)

*Primary Examiner* — Tan V Mai
(74) *Attorney, Agent, or Firm* — Winstead PC

(57) ABSTRACT

Embodiments provide a true random number generator. The true random number generator may include a first ring oscillator having a first frequency, a second ring oscillator having a second frequency, a third ring oscillator having a third frequency, and a capacitor connected between the second ring oscillator and the third ring oscillator to provide a capacitive coupling therebetween. The second frequency is lower than the first frequency, and the third frequency is lower than the second frequency. The true random number generator may further include a D-type flip-flop having a data input connected to an output of the first ring oscillator and having a clock input connected to an output of the third ring oscillator, wherein the D-type flip-flop is configured to generate an output signal representing a sequence of random numbers.

19 Claims, 5 Drawing Sheets

(56) References Cited

U.S. PATENT DOCUMENTS

| | | |
|---|---|---|
| 2013/0013657 A1 | 1/2013 | Emelko et al. |
| 2015/0154006 A1* | 6/2015 | Yang ..................... H03K 3/84 708/251 |

OTHER PUBLICATIONS

Dhanuskodi et al, "A Chaotic Ring Oscillator based Random Number Generator," IEEE International Symposium on Hardware-Oriented Security and Trust (HOST), May 7, 2014, pp. 160-165.

Amaki et al., "Jitter Amplifier for Oscillator-Based True Random Number Generator," 16th Asia and South Pacific Design Automation Conference (ASP-DAC), Jan. 28, 2011, pp. 81-82.

Bucci et al., "A High-Speed Oscillator-Based Truly Random Number Source for Cryptographic Applications on a Smart Card IC," IEEE Transactions on Computers, vol. 52, Apr. 2003, pp. 403-409.

Hosokawa et al., "Simple Chaotic Circuit Using CMOS Ring Oscillators," International Journal of Bifurcation and Chaos, vol. 14, No. 7, 2004., pp. 2513-2524.

Robson et al, "Truly Random Number Generator Based on a Ring Oscillator Utilizing Last Passage Time," IEEE Transactions on Circuits and Systems II: Express Briefs, vol. 61, No. 12, Dec. 2014, pp. 937-941.

Stefanou et al, "High Speed Array of Oscillator-Based Truly Binary Random Number Generators," IEEE Proceedings of the 2004 International Symposium on Circuits and Systems, vol. 1, 2004, pp. 505-508.

Golic, J.D., "New Methods for Digital Generation and Postprocessing of Random Data," IEEE Transactions on Computers, vol. 55, No. 10, Oct. 2006, pp. 1217-1229.

Matsumoto et al., "1200μm2 Physical Random-Number Generators Based on SiN MOSFET for Secure Smart-Card Application," IEEE International Solid-State Circuits Conference, 2008, pp. 414-624, see pp. 414-415 and 624.

Liu et al., "A True Random Number Generator Using Time-Dependent Dielectric Breakdown," 2011 Symposium on VLSI Circuits Digest of Technical Papers, 2011, pp. 216-217.

Suresh et al., "Entropy and Energy Bounds for Metastability Based TRNG with Lightweight Post-Processing," IEEE Transactions on Circuits and Systems I: Regular Papers, vol. 62, No. 7, Jul. 2015, pp. 1785-1793.

Wieczorek et al., "Dual-Metastability Time-Competitive True Random Number Generator," IEEE Transactions on Circuits and Systems I: Regular Papers, vol. 61, No. 1, Jan. 2014, pp. 134-145.

Tokunaga et al., "True Random Number Generator with a Metastability-Based Quality Control," IEEE International, Solid-State Circuits Conference, 2007, pp. 404-611, see pp. 404-405 and 611.

\* cited by examiner

TRUE RANDOM NUMBER GENERATOR AND SYSTEM COMPRISING THE SAME

CROSS-REFERENCE TO RELATED APPLICATIONS

The present application claims the benefit of the Singapore patent application No. 10201601393W filed on 24 Feb. 2016, the entire contents of which are incorporated herein by reference for all purposes.

TECHNICAL FIELD

Embodiments relate generally to a true random number generator and a system including the same.

BACKGROUND

Random number generators (RNG) are important parts of modern computing, which are computational or physical devices designed to generate a sequence of numbers or symbols that are random and cannot be reasonably predicted. They have a wide range of applications, ranging from gaming, statistical sampling and analysis, computer simulation, to and hardware security, in which the most important application of RNGs is in cryptography. In highly secured communication channels, data must be encrypted before sending out. RNGs are used to generate random cryptographic keys so that data can be transmitted securely. Although many encryption schemes are available, they all depend on the randomness of RNG to make the "keys" unpredictable and thus data can be decrypted without a proper decipher.

RNG can be broadly categorized into Pseudo-random number generator (PRNG) and true-random number generator (TRNG). PRNGs use complex computational algorithms to generate a sequence of numbers which appears to be random. Quality of the sequence depends on the algorithm being used. PRNGs usually offer higher throughput and are easier to implement when compared to TRNG. On the other hand, TRNGs generate random sequences based on inherent property of a physical process, such as thermal noise, shot noise or even nuclear decay radiation. The phenomenon is nondeterministic and thus the output sequence is random. However, these noise sources are usually very small and amplification is required. Furthermore, the throughput may be limited due to the bandwidth of the analog amplifier.

Ring Oscillator (RO) based TRNGs take advantage of inherent jitter noise to realize the randomness of the output bit stream, and represent an attractive approach which consumes little power and area overhead. FIG. 1 shows a schematic diagram of a conventional RO-based true random number generator. The RO-based TRNG 100 has a fast RO 101 ($RO_1$ with a higher frequency $f_1$) connected to the D port of a D-type flip flop (DFF) 105, and a slow RO 103 ($RO_2$ with a lower frequency $f_2$) connected to the CLK port of the DFF 105.

Accordingly, the lower frequency RO 103 is used to output a clock signal to the DFF 105 to sample data from the higher frequency RO 101. At the rising edge of the clock, data at D port will be latched out. Assuming that $f_1$ is high enough and inherent jitter of $f_2$ is sufficiently large (when compared to the period of $f_1$), the exact rising time of the slow clock signal can be considered as random and thus the output at Q port of the DFF 105 at each clock cycle is nondeterministic. Accordingly, the DFF 105 outputs random bits.

Due to the design simplicity and ease of integration, jittered ROs are frequently used to produce random output stream. The main challenge in these designs is to effectively amplify jitter of the slow RO which acts as the clock signal source.

The quality of the RO-based TRNG 100, i.e. the randomness of the output bits, largely depends on the amount of jitter of the slow RO output and 50% duty cycle of the fast RO output. Since the inherent jitter of a RO is usually very small (e.g., less than 0.1% of its period), $f_1$ is required to be extremely fast (e.g., $f_1 > 1000 \times f_2$) so that the output bits can be considered random. This would lead to higher power consumption.

To reduce the requirement on the high frequency $f_1$, there are approaches to amplify the jitter of the slow RO 103 by using analog circuits to inject noise, increasing the number of stages, or using diode or resistive coupling. As a result, jitter of $f_2$ can be as high as 2% of $T_{f2}$. $T_{f2}$ is the oscillation period of the slow RO 103. The jitter provided in these approaches is still limited, especially at low frequency and voltage range, and thus is not scalable. At this rate of the jitter, $f_1$ is still required to be at least 50× higher than $f_2$. Since high frequency RO is the dominant source of power consumption, further reduction of $f_1$ is highly desirable, especially for portable devices and sensor node applications. Further, the large number of stages or additional analog circuits required by the RO-based TRNGs may also result in large area and power overhead.

SUMMARY

Various embodiments provide a true random number generator. The true random number generator may include a first ring oscillator having a first frequency, a second ring oscillator having a second frequency, a third ring oscillator having a third frequency, and a capacitor connected between the second ring oscillator and the third ring oscillator to provide a capacitive coupling therebetween. The second frequency is lower than the first frequency, and the third frequency is lower than the second frequency. The true random number generator may further include a D-type flip-flop having a data input connected to an output of the first ring oscillator and having a clock input connected to an output of the third ring oscillator, wherein the D-type flip-flop is configured to generate an output signal representing a sequence of random numbers.

Various embodiments further provide a system for generating random numbers. The system may include a first ring oscillator having a first frequency, and a plurality of random number generators. Each random number generator may include a respective second ring oscillator having a respective second frequency, a respective third ring oscillator having a respective third frequency, a respective capacitor connected between the respective second ring oscillator and the respective third ring oscillator to provide a capacitive coupling therebetween, a respective first D-type flip-flop having a data input connected to a first output of the first ring oscillator and having a clock input connected to a first output of the respective third ring oscillator, and a respective second D-type flip-flop having a data input connected to a second output of the first ring oscillator and having a clock input connected to a second output of the respective third ring oscillator. The respective second frequency is lower than the first frequency, and the respective third frequency is lower than the respective second frequency. The second output of the first ring oscillator is complementary to the first output of the first ring oscillator, and the first output and the second output of the respective third ring oscillator are output from different nodes of the respective third ring oscillator. The first D-type flip-flop is configured to generate a respective first output signal representing a respective first sequence of random numbers, and the second D-type flip-flop is configured to generate a respective second output signal representing a respective second sequence of random numbers.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized, and structural and logical changes may be made without departing from the scope of the invention. The various embodiments are not necessarily mutually exclusive, as some embodiments can be combined with one or more other embodiments to form new embodiments.

According to various embodiments, a robust and scalable true random number generator (TRNG) with high throughput is provided, which achieves improved randomness with a simple structure. Further, the TRNG of the various embodiments occupies small active area and consumes low power.

Figure 2:
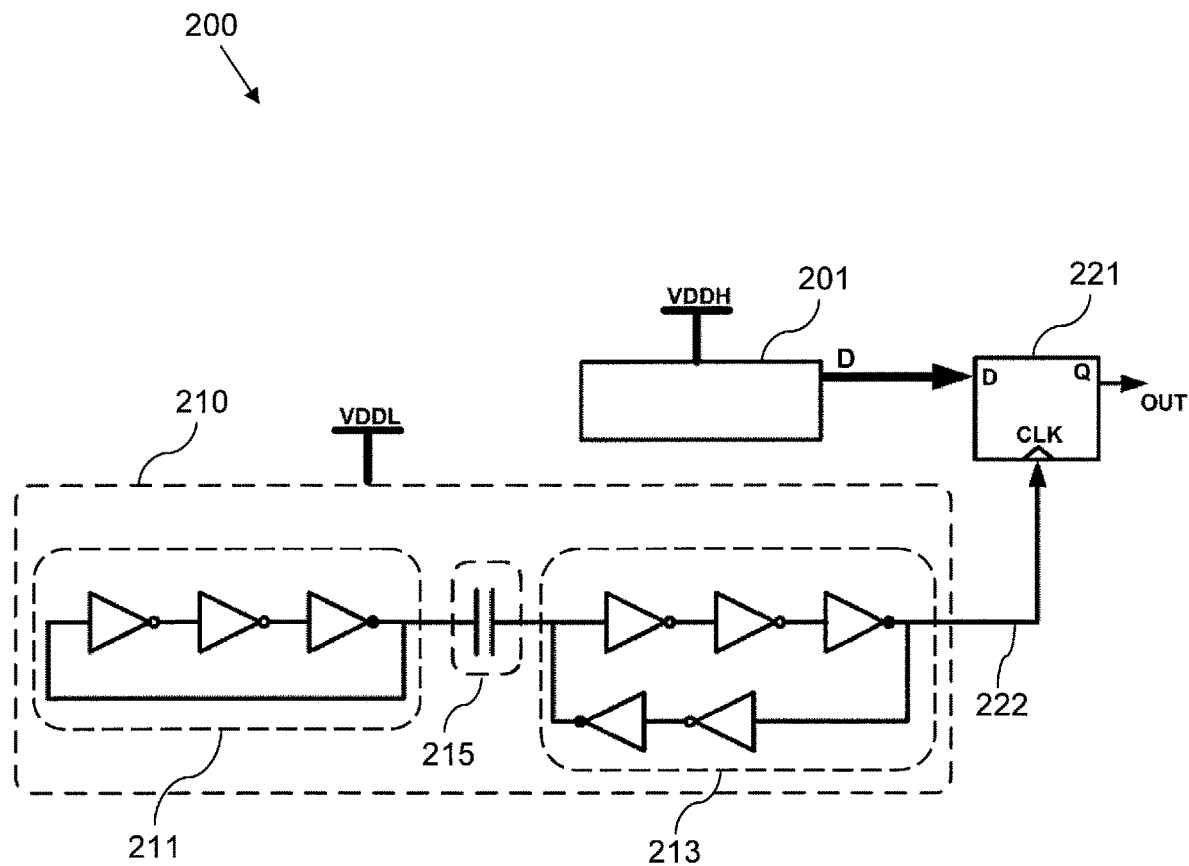
FIG. 2 shows a schematic diagram illustrating a true random number generator according to various embodiments.

FIG. 2 shows a schematic diagram illustrating a true random number generator (TRNG) according to various embodiments.

As shown in FIG. 2, the true random number generator 200 may include a first ring oscillator (RO) 201 having a first frequency, a second ring oscillator 211 having a second frequency, a third ring oscillator 213 having a third frequency, and a capacitor 215 connected between the second ring oscillator 211 and the third ring oscillator 213 to provide a capacitive coupling therebetween. The second frequency is lower than the first frequency, and the third frequency is lower than the second frequency. The true random number generator 200 may further include a D-type flip-flop (DFF) 221 having a data input connected to an output D of the first ring oscillator 201 and having a clock input connected to an output 222 of the third ring oscillator 213, wherein the D-type flip-flop 221 is configured to generate an output signal representing a sequence of random numbers.

In other words, various embodiments provide a RO (Ring Oscillator) based TRNG 100, in which two slow ROs, i.e. the second ring oscillator 211 and the third ring oscillator 213, are capacitively coupled with each other via a capacitive coupling device, e.g. a capacitor. The capacitive coupling between the two slow ROs increases jitters in the output 222 of the third ring oscillator 213, which acts as the clock signal of the D-type flip-flop 221 for sampling the high frequency output signal D of the fast RO 201. Thus, the output signal of the D-type flip-flop 221 is obtained with increased randomness.

In this context, the first ring oscillator 201, also denoted as $RO_1$, is referred as a high frequency RO or a fast RO, as the first frequency $f_1$ is higher than both the second frequency $f_{11}$ and the third frequency $f_{12}$. The second ring oscillator 211 (denoted as $RO_{11}$) and the third ring oscillator 213 (denoted as $RO_{12}$) are each referred to as a low frequency RO or a slow RO accordingly. In an exemplary embodiment, the first ring oscillator 201 may have a frequency of 1 GHz, while the second ring oscillator 211 and the third ring oscillator 213 may have frequencies of 70 MHz and 50 MHz, respectively. The third ring oscillator 213 has a lower frequency than the second ring oscillator 211, and is shown in FIG. 2 with more inverter stages than the second ring oscillator 211. However, it is understood that the number of inverter stages of the second ring oscillator 211 and the third ring oscillator 213 shown in FIG. 2 is for illustrative purpose only, and various different number of inverter stages or delay stages can be included in each of the second ring oscillator 211 and the third ring oscillator 213 to provide the clock signal with a suitable frequency.

In this context, the first frequency refers to the oscillation frequency of the first ring oscillator, i.e. the frequency of the output of the first ring oscillator. Similarly, the second frequency and the third frequency refer to the oscillation frequency of the second ring oscillator (i.e. the frequency of the output of the second ring oscillator) and the oscillation frequency of the third ring oscillator (i.e., the frequency of the output of the third ring oscillator), respectively.

In an embodiment, the second ring oscillator 211 and the third ring oscillator 213 are capacitively coupled by the capacitor 215 without a direct current (DC) path between the second ring oscillator 211 and the third ring oscillator 213. In other words, the second ring oscillator 211 and the third ring oscillator 213 are coupled or connected with each other only via the capacitor 215 and corresponding wiring for such a connection, without any other electronic components connected between the second ring oscillator 211 and the third ring oscillator 213 to provide a DC path therebetween. In this context, the capacitor 215 may be a single capacitor, or a plurality of capacitors in series or parallel connection.

According to various embodiments, the capacitor 215 has a capacitance in the order of femtofarads (fF). The size or capacitance of the coupling capacitor 215 may be determined by matching it with the driving capability of the inverters in the ring oscillators 211, 213. Optimum capacitor size may be determined through simulations. In an exemplary embodiment, the capacitor 215 of several femtofarads is suitable for ring oscillators using minimum-size inverters.

According to various embodiments, the capacitive coupling provided by the capacitor 215 is configured to increase or amplify jitter in the output of the third ring oscillator 213. As shown in FIG. 2, the capacitor 215 couples the second ring oscillator 211 and the third ring oscillator 213 to form a chaotic system 210 which has a very large jitter, resulting in a much larger jitter at the output 222 of the third ring oscillator 213 when compared with conventional approaches.

In various embodiments, jitter in the output 222 of the third ring oscillator 213 is scalable with a supply voltage $V_{DDL}$ applied to the third ring oscillator 213.

In various embodiments, the output 222 of the third ring oscillator 213 may include jitter larger than a period ($T_{f1}$) of the output of the first ring oscillator 201, thereby achieving good randomness.

According to various embodiments, the first frequency $f_1$ of the first ring oscillator 201 may be significantly or substantially higher than the third frequency $f_{12}$ of the third ring oscillator 213, so as to achieve or increase the randomness of the output signal. In an exemplary embodiment, the first frequency $f_1$ is about 10-20 times higher than the third frequency $f_{12}$. In another exemplary embodiment, the first frequency $f_1$ is about 5-10 times higher than the third frequency $f_{12}$.

In an illustrative embodiment, since jitter in the output 222 of the third ring oscillator 213 is amplified via the capacitive coupling provided by the capacitor 215, the first frequency $f_1$ can be reduced. For example, when the second frequency $f_{11}$ of 150-200 MHz and the third frequency $f_{12}$ of 100 MHz are provided, the first frequency $f_1$ may be provided as 1 GHz.

In various embodiments, the first ring oscillator 201 is configured to receive a first supply voltage $V_{DDH}$, and the second ring oscillator 211 and the third ring oscillator 213 are configured to receive a second supply voltage $V_{DDL}$. The second supply voltage $V_{DDL}$ may be lower than the first supply voltage $V_{DDH}$. In an exemplary embodiment, the first ring oscillator 201 is operated using the high supply voltage $V_{DDH}$ (e.g., 1.2V), and the second ring oscillator 211 and the third ring oscillator 213 are operated using the much lower supply voltage $V_{DDL}$ since the second ring oscillator 211 and the third ring oscillator 213 are significantly or substantially slower than the first ring oscillator 201. The lower second supply voltage not only increases jitter but also reduce power and energy consumption of the chaotic system 210. In addition, the use of the lower second supply voltage eliminates the need for more stages in the slow ROs 211, 213, and thus reduces the area consumption. Thus, lowering the second supply voltage is more efficient than adding the number of delay stages in the slow ROs 211, 213. In other embodiments, the second supply voltage $V_{DDL}$ may be equal to the first supply voltage $V_{DDH}$, with more stages in the slow ROs 211, 213 for example. The second supply voltage $V_{DDL}$ may also be supplied to the D-type flip-flop 221.

Figure 3:
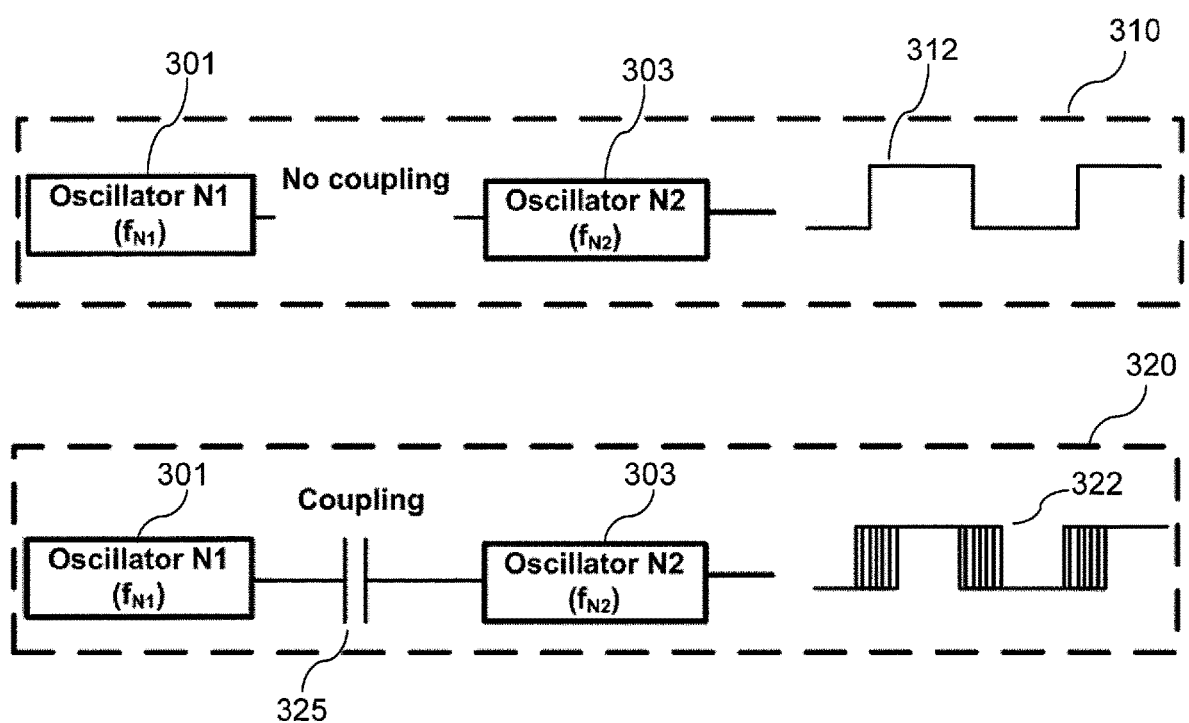
FIG. 3 shows a schematic diagram illustrating an impact of capacitive coupling on the jitter of a ring oscillator according to various embodiments.

FIG. 3 shows a schematic diagram illustrating an impact of capacitive coupling on the jitter of a ring oscillator according to various embodiments.

As denoted in the scenario 310, without coupling between an oscillator N1 301 with a frequency $f_{N1}$ and an oscillator N2 303 with a frequency $f_{N2}$, the oscillators 301 and 303 are two independent oscillators. Accordingly, the oscillator 303 only has its intrinsic jitter caused by thermal noise, resulting in an output 312 of the oscillator 303 almost without jitter.

In the scenario 320, the oscillator 301 is coupled with the oscillator 303 via a capacitor 325, similar to the second oscillator 211 being coupled with the third oscillator 213 via the capacitor 215 shown in FIG. 2. With capacitive coupling, the two oscillators 301 and 303 will entangle while trying to oscillate with their own intrinsic frequencies, hence creating a chaotic system. As a result, the exact rising and falling time of the output of the oscillator N2 303 becomes probabilistic/non-deterministic. The oscillator N1 301 effectively shifts the edge of the signal of the oscillator N2 303 backward or forward depending on the instantaneous chaotic coupling between the two oscillators 301, 303 at around the edge of the signal of the oscillator N2 303. Apparently, the stronger the entanglement between the two oscillators, the larger the shifting and thus the larger the jitter in the output 322 of the oscillator N2 303. Accordingly, the clock signal as provided by the third oscillator 213 in FIG. 2 may be similar to the output 322 with large jitter in FIG. 3.

By providing capacitive coupling between the two slow ROs 211, 213 using capacitor 215 according to the embodiments above, several advantages may be achieved. First, in capacitive coupling, there is no direct current path between the two slow ROs 211, 213. Thus, the two slow ROs 211, 213 cross-talk, but do not alternate the intrinsic frequencies of each other. Second, the capacitive coupling effect is always available regardless of the voltages across the capacitor 215. As a result, the TRNG 200 is robust and is suitable even in subthreshold supply voltage condition. Accordingly, the TRNG 200 is scalable and is able to operate in subthreshold region to reduce power consumption. Further, it can be easily implemented in standard CMOS technologies. This is advantageous over a conventional diode-coupling design in which the coupling effect diminishes when the voltage across the diode falls below the threshold voltage, and advantageous over a conventional MOS-resistor coupling design in which there is little coupling if the slow ROs operate in subthreshold region.

Figure 4:
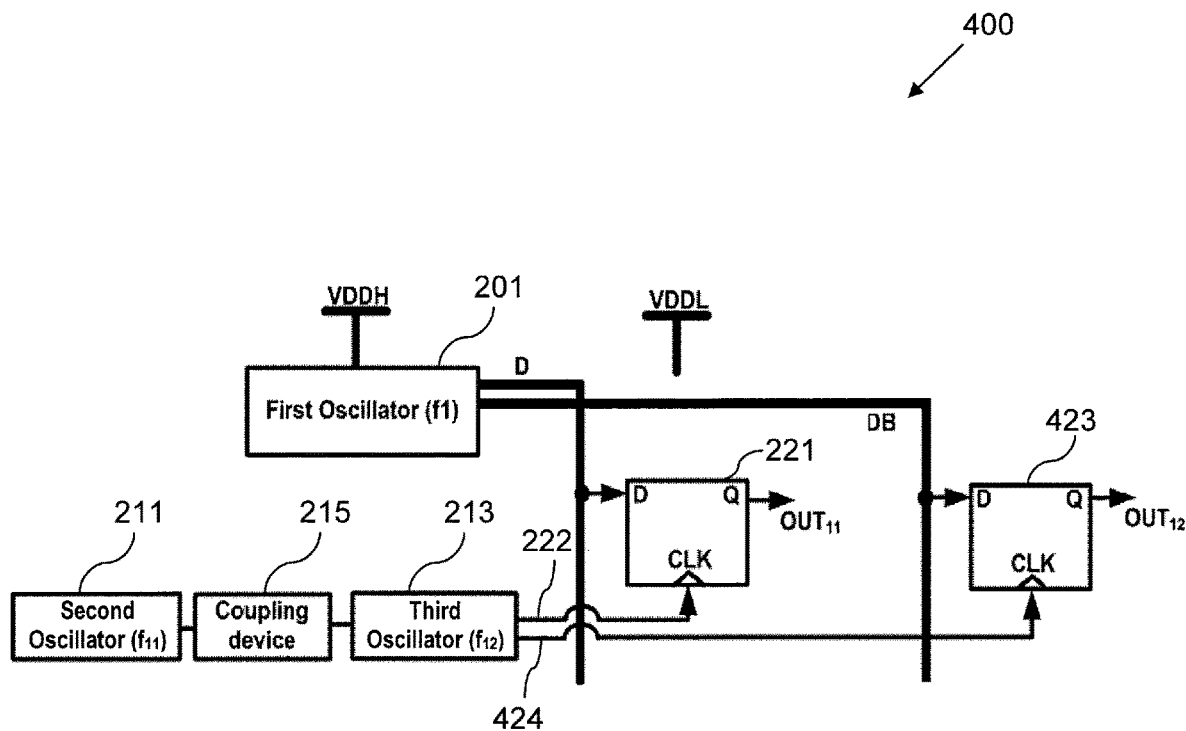
FIG. 4 shows a schematic diagram illustrating a true random number generator according to various embodiments.

FIG. 4 shows a schematic diagram illustrating a true random number generator according to various embodiments.

The TRNG 400 in the embodiments of FIG. 4 may be similar to or may include the TRNG 200 of FIG. 2 above. Accordingly, the TRNG 400 similarly includes the first ring oscillator 201 having the first frequency $f_1$, the second ring oscillator 211 having the second frequency $f_{11}$, the third ring oscillator 213 having the third frequency $f_{12}$, the coupling capacitor 215 connected between the second ring oscillator 211 and the third ring oscillator 213 to provide the capacitive coupling, and the D-type flip-flop 221 having the data input connected to the output D of the first ring oscillator 201 and having the clock input connected to the output 222 of the third ring oscillator 213. The second frequency $f_{11}$ is lower than the first frequency $f_1$, and the third frequency $f_{12}$ is lower than the second frequency $f_{11}$. The D-type flip-flop 221 is configured to generate the output signal $OUT_{11}$ representing a sequence of random numbers.

Various embodiments of the TRNG 200 described above are analogously valid for the embodiments of the TRNG 400 of FIG. 4, and vice versa.

The TRNG 400 further includes a further D-type flip-flop 423 generating a further output signal $OUT_{12}$ representing a further sequence of random numbers. The further D-type flip-flop 423 has a data input connected to a further output DB of the first ring oscillator 201, and has a clock input connected to a further output 424 of the third ring oscillator 213. The further output DB of the first ring oscillator 201 is complementary to the output D of the first ring oscillator 201. The further output 424 of the third ring oscillator 213 is from a different node (e.g., an output node of a different delay or inverter stage) of the third ring oscillator 213 compared with the output 222 of the third ring oscillator 213. The further output 424 of the third ring oscillator 213 may be different from the output 222 of the third ring oscillator 213, and may be or may not be complementary to the output 222 of the third ring oscillator.

Similar to the embodiments described in FIG. 2 above, the first ring oscillator 201 is configured to receive the first supply voltage $V_{DDH}$, and the second ring oscillator 211 and the third ring oscillator 213 are configured to receive the second supply voltage $V_{DDL}$. The second supply voltage $V_{DDL}$ may be lower than or equal to the first supply voltage $V_{DDH}$. The second supply voltage $V_{DDL}$ may also be supplied to the D-type flip-flop 221 and the further D-type flip-flop 423.

According to an embodiment, the TRNG 400 may further include a XOR gate (not shown) configured to combine the output signal $OUT_{11}$ of the D-type flip-flop 221 and the further output signal $OUT_{12}$ of the further D-type flip-flop 423 to generate a combined output signal.

In the RO-based TRNG configuration, data of the fast $RO_1$ 201 is sampled by high jitter $RO_{12}$ 213. At random rising edge of the output of the $RO_{12}$ 213, the probability that a number 1 (or 0) is sampled equals to the probability that the output of the fast $RO_1$ 201 equals to 1 (or 0), i.e. duty cycle of $RO_1$. Since a non-calibrated RO may have a duty cycle different from 50%, the output bit stream may be biased. For example, if the duty cycle of the fast $RO_1$ 201 is 60%, statistically 60% of the output bits of the D-type flip flop 221 will be 1. Accordingly, if the output is biased to either 1 or 0, the fast $RO_1$ 201 may need to be calibrated to 50% duty cycle to provide better entropy (i.e. the observed probabilities of 1 and 0 are the same). Another approach to ensure 50% duty cycle signal at the output of the fast $RO_1$ 201 is to insert a frequency divider, which may reduce the throughput with additional power consumption.

The embodiments of the TRNG 400 as shown in FIG. 4 use dual sampling to eliminate the possibility of biased output stream. Instead of calibrating $RO_1$ 201 to achieve 50% duty cycle, the output D of $RO_1$ 201 is sampled by the D-type flip flop 221 and the further output DB of $RO_1$ 201 is sampled by the further D-type flip flop 423, using separate clock signals 222, 424 from the $RO_{12}$ 213. The output D and the further output DB are complementary signals. For example, if the output D signal has a duty cycle of 40%, the further output DB signal has a duty cycle of 60% accordingly. The clock signals of the D-type flip flop 221 and the further D-type flip flop 423 are taken as the outputs 222, 424 from different nodes of the same $RO_{12}$ 213, respectively. As a result, the combined output sequences $OUT_{11}$, $OUT_{12}$ from these two D-type flip flops 221, 423 give 50% probability of 1 and 0, i.e. an unbiased bit stream. For example, if the output D signal has a duty cycle of 60%, the further output DB signal has a duty cycle of 40% accordingly. Thus, the probability of "1" in the output streams $OUT_{11}$ and $OUT_{12}$ of the two D-type flip flops 221, 423 would be 60% and 40%, respectively. Combining the two output streams $OUT_{11}$ and $OUT_{12}$ will provide a balanced and unbiased bit stream.

The output signal $OUT_{11}$ of the D-type flip-flop 221 and the further output signal $OUT_{12}$ of the further D-type flip-flop 423 may be combined using the XOR gate to generate the combined output signal. The combined output signal is a non-biased bit stream with a doubled throughput, thus doubling the bit rate. According to this embodiment, the throughput is doubled with only marginally additional power consumption as the main power is consumed by the high frequency $RO_1$ 201.

Illustratively, at any sampling point $t_0$ of the data signal data($t_0$) output from the high frequency $RO_1$ 201, $$P(x=1)=P(\text{data}(t_0)=1, t_{min}<t_0<t_{max})$$

$$\text{jitter}=t_{max}-t_{min}$$

wherein P(x=1) represents a probability of the output data of the DFF 221 to be 1. Accordingly, the output data of the DFF 221 may be biased, if the duty cycle (β) of the input data signal data($t_0$) is not 50%.

According to the embodiments of FIG. 4, the complimentary outputs D and DB from the high frequency $RO_1$ 201 are fed to two different DFFs 221, 423, which are clocked by two different clock signals 222, 424 from the third oscillator 213. Accordingly, $$E(OUT_{11}) = E(D) = \beta;$$

$$E(OUT_{12}) = E(DB) = 1 - \beta;$$

$$E(x) = 0.5 * (E(OUT_{11}) + E(OUT_{12}))$$
$$= 0.5 * (E(D) + E(DB)) = 0.5 * (\beta + (1 - \beta)) = 0.5$$

wherein E represents an expected value. Accordingly, combining the two output streams $OUT_{11}$ and $OUT_{12}$ will provide a balanced and unbiased bit stream.

Figure 5:
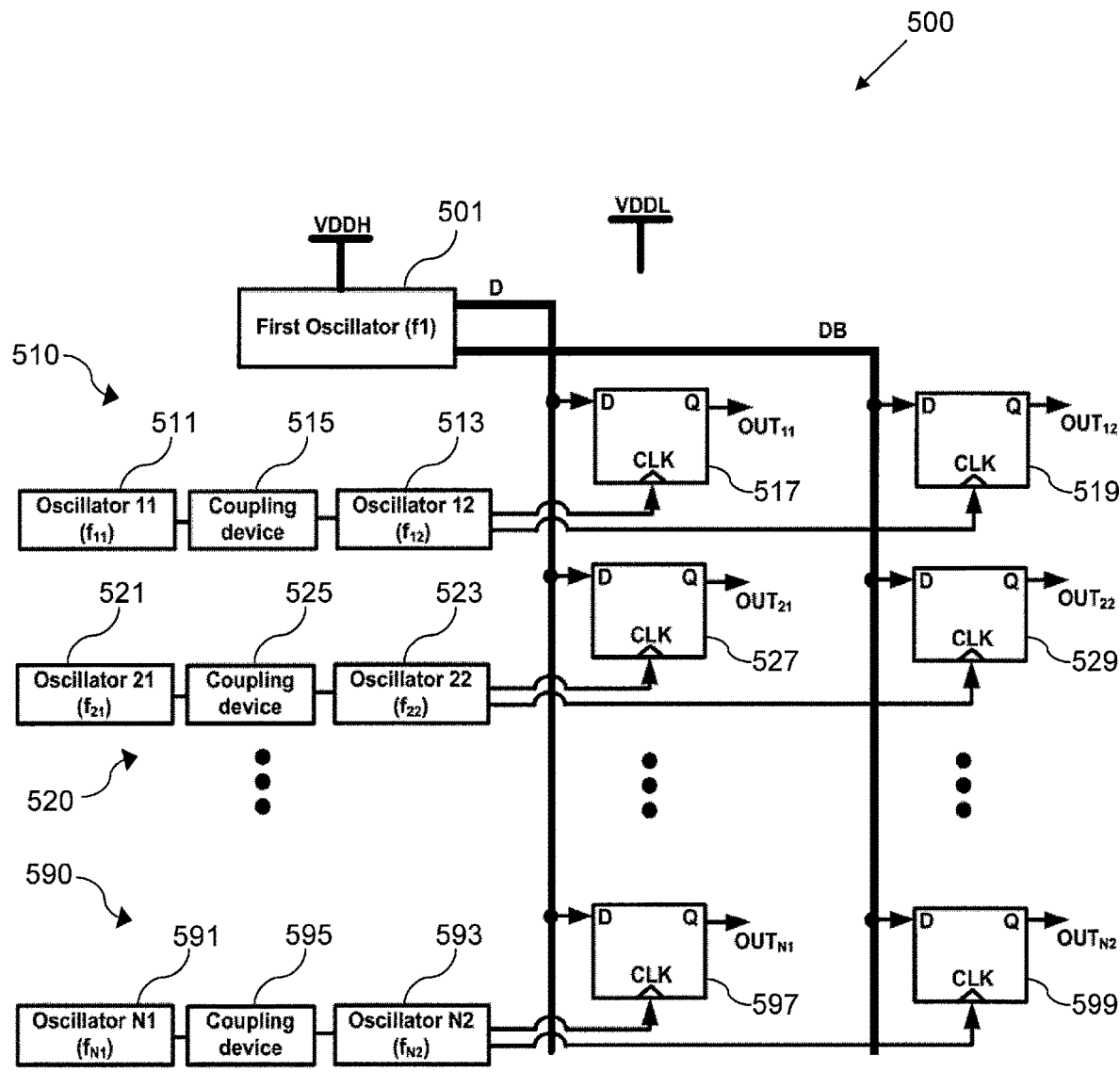
FIG. 5 shows a schematic diagram illustrating a system for generating random numbers according to various embodiments.

FIG. 5 shows a schematic diagram illustrating a system for generating random numbers according to various embodiments.

As shown in FIG. 5, the system 500 for generating random numbers includes a first ring oscillator 501 having a first frequency $f_1$, and a plurality of random number generators 510, 520, . . . , 590.

Each of the random number generators (510, 520, . . . , 590) includes a respective second ring oscillator (511, 521, . . . , 591) having a respective second frequency ($f_{11}$, $f_{21}$, . . . , $f_{N1}$), a respective third ring oscillator (513, 523, . . . , 593) having a respective third frequency ($f_{12}$, $f_{22}$, . . . , $f_{N2}$), a respective capacitor (515, 525, . . . , 595) connected between the respective second ring oscillator (511, 521, . . . , 591) and the respective third ring oscillator (513, 523, . . . , 593) to provide the capacitive coupling. The respective second frequency ($f_{11}$, $f_{21}$, $f_{N1}$) is lower than the first frequency $f_1$, and the respective third frequency ($f_{12}$, $f_{22}$, . . . , $f_{N2}$) is lower than the second frequency ($f_{11}$, $f_{21}$, . . . $f_{N1}$) in the respective random number generator (510, 520, . . . , 590).

Each random number generator (510, 520, . . . , 590) further includes a respective first D-type flip-flop (517, 527, . . . , 597) having a data input connected to a first output D of the first ring oscillator 501 and having a clock input connected to a first output of the respective third ring oscillator (513, 523, . . . , 593), and a second D-type flip-flop (519, 529, . . . , 599) having a data input connected to a second output DB of the first ring oscillator 501 and having a clock input connected to a second output of the respective third ring oscillator (513, 523, . . . , 593). The second output DB of the first ring oscillator 501 is complementary to the first output D of the first ring oscillator 501. The second output of the respective third ring oscillator (513, 523, . . . , 593) is from a different node (e.g., an output node of a different delay/inverter stage) of the third ring oscillator compared with the first output of the respective third ring oscillator (513, 523, . . . , 593). The second output of the respective third ring oscillator (513, 523, . . . , 593) may be different from the first output of the respective third ring oscillator (513, 523, . . . , 593), and may be or may not be complementary to the first output of the respective third ring oscillator (513, 523, . . . , 593). Each of the first D-type flip-flops (517, 527, . . . , 597) is configured to generate a respective first output signal ($OUT_{11}$, $OUT_{21}$, . . . , $OUT_{N1}$) representing a respective first sequence of random numbers. Each of the second D-type flip-flops (519, 529, . . . , 599) is configured to generate a respective second output signal (OUT$_{12}$, OUT$_{22}$, ..., OUT$_{N2}$) representing a respective second sequence of random numbers.

The respective random number generator (510, 520, ..., 590) included in the embodiments of the system 500 is similar to the random number generator 400 in the embodiments of FIG. 4 above, with the difference that the first ring oscillator 501 is shared by the plurality of random number generators (510, 520, ..., 590). Various embodiments of the random number generator 200, 400 described with reference to FIG. 2 and FIG. 4 above are analogously valid for the embodiments of the system 500 of FIG. 5, and vice versa.

Figure 1:
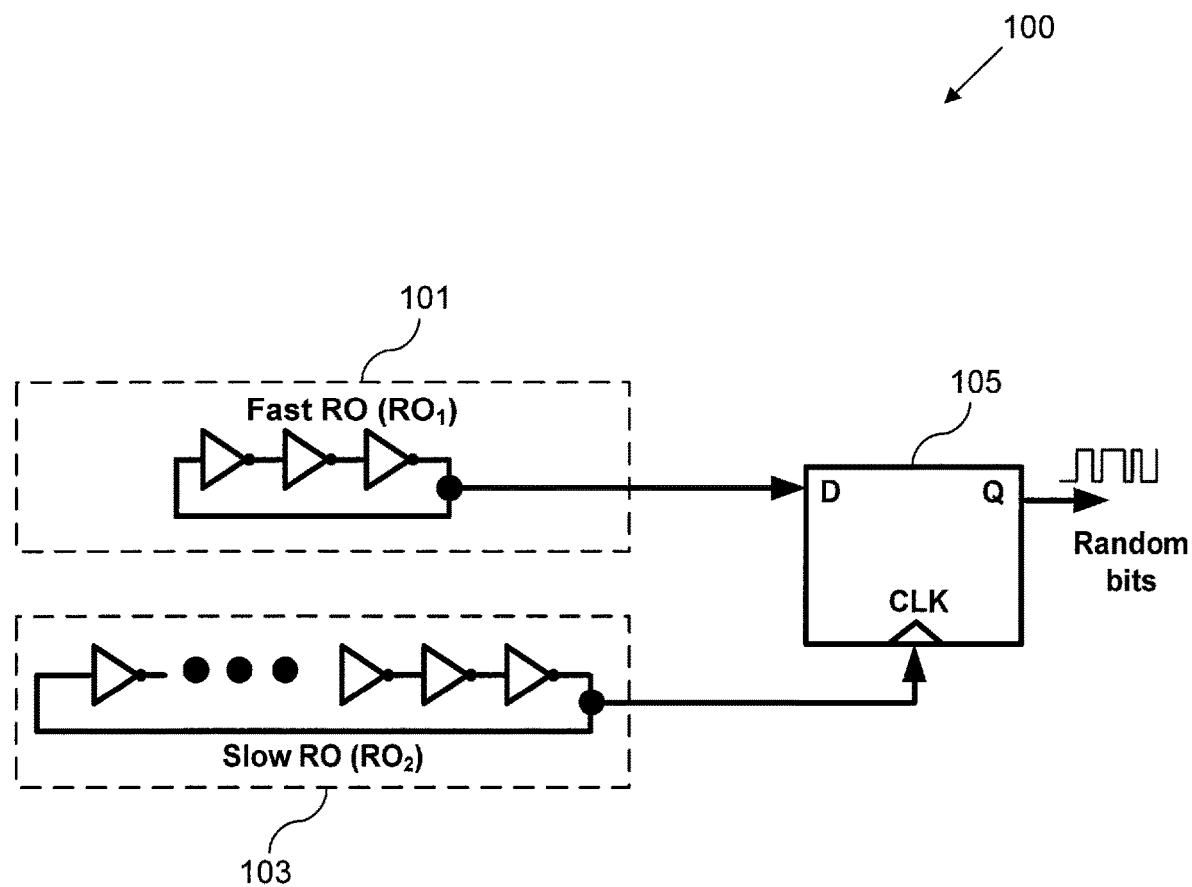
FIG. 1 shows a schematic diagram illustrating a conventional RO-based true random number generator.

To increase the throughput of a system for random number generation, one approach is to proportionally increase frequencies of the first ring oscillator, the second ring oscillator and the third ring oscillator. Another approach is to create an array of random number generators to form a whole system. Both approaches would lead to a linear increase in power consumption. In a single random number generator, e.g. shown in FIG. 1, FIG. 2 and FIG. 4 above, the fast ring oscillator RO$_1$ is the most power-hungry component, because it has the highest switching frequency and may operate under the higher voltage V$_{DDH}$. Based on this observation, the embodiments of the system 500 have an architecture to share the high frequency ring oscillator RO$_1$ 501 among an array of harvesters (i.e. the random number generators 510, 520, ..., 590), which increases throughput without significantly increasing power consumption.

In other words, to achieve higher throughput with low power consumption, a shared architecture having N rows of output streams is provided in the embodiments of FIG. 5. Each row (i.e., each random number generators 510, 520, ..., 590) includes a jitter-amplified third RO with the respective third frequency f$_{k2}$ (k=1, 2, ..., N), and two D-type flip flops receiving complementary data inputs D and DB. The second frequency f$_{k1}$ and the third frequency f$_{k2}$ are independent, and their intrinsic frequencies depend on random process variations. The high frequency ring oscillator RO$_1$ 501 is shared by D-type flip flops of the plurality of rows, thereby reducing both power and area consumption. Randomness of the system 500 can be achieved if the first frequency f$_1$ is sufficiently high and jitter of each row is sufficiently large.

According to various embodiments, in order to avoid or reduce correlation between the output sequences of different random number generators (510, 520, ..., 590) in the array, the second ring oscillators and the third ring oscillators in different random number generators (510, 520, ..., 590) are isolated and/or sized differently (e.g. by using different transistor sizes, or using different number of inverter stages, or a combination of both), as long as their intrinsic frequencies lies within a desired range.

According to various embodiments, the second ring oscillators (511, 521, ..., 591) in different random number generators (510, 520, ..., 590) have at least one of different transistor sizes or different number of inverter stages from each other. According to various embodiments, the third ring oscillator (513, 523, ..., 593) in different random number generators (510, 520, ..., 590) have at least one of different transistor sizes or different number of inverter stages from each other. The differences of the second ring oscillators (511, 521, ..., 591) and the differences of the third ring oscillator (513, 523, ..., 593) may be provided alternatively or in combination in the system 500. According to various embodiments, the second ring oscillators (511, 521, ..., 591) in different random number generators (510, 520, ..., 590) may be isolated from each other. According to various embodiments, the third ring oscillator (513, 523, ..., 593) in different random number generators (510, 520, ..., 590) may be isolated from each other.

Similar to the embodiments of FIG. 2 and FIG. 4 described above, the respective second ring oscillator and the respective third ring oscillator are capacitively coupled by the respective capacitor (515, 525, ..., 595) without a direct current (DC) path between the respective second ring oscillator and the respective third ring oscillator in each of the plurality of random number generators (510, 520, ..., 590).

According to various embodiments, in each of the plurality of random number generators (510, 520, ..., 590), the capacitive coupling provided by the respective capacitor is configured to increase jitter in the first output and the second output of the respective third ring oscillator. According to various embodiments, the capacitor in each of the plurality of random number generators (510, 520, ..., 590) has a capacitance in the order of femtofarads.

According to various embodiments, in each of the plurality of random number generators (510, 520, ..., 590), jitter in the first output and the second output of the respective third ring oscillator is scalable with a supply voltage applied to the respective third ring oscillator.

According to various embodiments, in each of the plurality of random number generators (510, 520, ..., 590), the first output and the second output of the respective third ring oscillator include jitter larger than a period of the first output D and the second output DB of the first ring oscillator 501.

According to various embodiments, the first ring oscillator is configured to receive a first supply voltage V$_{DDH}$; and the second ring oscillator and the third ring oscillator of each random number generator (510, 520, ..., 590) are configured to receive a second supply voltage V$_{DDL}$. In an exemplary embodiment, the second supply voltage V$_{DDL}$ is lower than the first supply voltage V$_{DDH}$. In other embodiments, the second supply voltage V$_{DDL}$ may be equal to the first supply voltage V$_{DDH}$. In other embodiments, the second supply voltage V$_{DDL}$ may be equal to the first supply voltage V$_{DDH}$, with more stages in the second ring oscillators and the third ring oscillators, for example.

According to various embodiments, the first frequency f$_1$ is significantly or substantially higher than the third frequency (f$_{12}$, f$_{22}$, ..., f$_{N2}$) of each random number generator. In an illustrative example, the first frequency f$_1$ is about 10 times of the third frequency (f$_{12}$, f$_{22}$, ..., f$_{N2}$).

According to various embodiments, each random number generator may further include a respective XOR gate configured to combine the first output signal (OUT$_{11}$, OUT$_{21}$, ..., OUT$_{N1}$) of the first D-type flip-flop and the second output signal (OUT$_{12}$, OUT$_{22}$, ..., OUT$_{N2}$) of the second D-type flip-flop in the respective random number generator to generate a combined output signal of each random number generator.

In the embodiments of FIG. 5, since the jitters in the clocking ROs (513, 523, ..., 593) determine the randomness, at each sampling time the probability P$_{(Q=1)}$ of the output data at each D-type flip flop to be 1 is independent from each other, as long as f$_1$ is fast enough. Output data streams from the first D-type flip flop and the second D-type flip flop may be XOR-ed to further improve the entropy.

Illustratively, if X and Y are independent random bits with E(X)=μ, and E(Y)=ν, then E(XβY)=μ+ν−2μν=0.5−2(μ−0.5)(ν−0.5), which is closer to 0.5.

According to various embodiments, several designing factors may need to be engineered to ensure the randomness of the output stream of the random number generator 200, 400 and the system 500 above, as described below.

In various embodiments, the first frequency $f_1$ of the first ring oscillator (201, 501) may be configured to be substantially or significantly higher than the third frequency $f_{k2}$ (k=1, 2, ... N) of each third ring oscillator (213, 513, 523, ..., 593) which is the intrinsic oscillating frequency of the slow ring oscillator in each chaotic system. In an exemplary embodiment, $f_1$ may be 10 time to 20 times higher than $f_{12}$, which helps to reduce $f_1$ compared to existing method.

In various embodiments, the size of the coupling capacitor may be configured to match the driving capability of the inverters in the ROs. If the size of the capacitor is too small, the coupling effect diminishes. On the other hand, if the size of the capacitor is too large, the ROs themselves cannot oscillate. In an exemplary embodiment, a capacitor of several femtofarad (fF) is suitable for ROs using all minimum-size inverters. Optimum capacitor size may be determined through simulations.

In various embodiments, the second frequency $f_{k1}$ (k=1, 2, ... N) is configured to be higher or faster than the third frequency $f_{k2}$. This may be realized by using more delay stages in $RO_{k2}$ than that of $RO_{k1}$. For example, 5 stages in $RO_{k2}$ versus 3 stages in $RO_{k1}$, or 7 stages in $RO_{k2}$ versus 5 stages in $RO_{k1}$ may be provided. In an exemplary embodiment, $f_{k1}<2\times f_{k2}$ may be configured, so as to reduce power consumption in $RO_{k1}$ and reduce the number of stages in $RO_{k2}$.

In various embodiments, to avoid correlation between output streams from different channels (e.g. in the system 500), each chaotic system formed by the respective second oscillator, third oscillator and the coupling capacitor, may be configured to be different from each other, i.e. to be unique. Although random process variations ensure distinctive characteristic of each chaotic system, this difference may not be enough. In various embodiments, different transistor sizing in each ROs and/or different number of inverter/delay stages may be used. The strategy is to purposely vary the intrinsic frequency of each ROs, as long as it is in the acceptable range.

According to various embodiments described above with reference to FIGS. 2, 4 and 5, capacitive coupling is used to create a chaotic system to achieve large jitter with reduced or minimum number of inverter stages in the ring oscillators. High VDD ($V_{DDH}$) is used for the fast $RO_1$ while the rests of the random number generator 200, 400 or the system 500 may use the low VDD ($V_{DDL}$). In the embodiments of FIGS. 4 and 5, dual sampling, i.e., sampling both D and DB outputs of the fast $RO_1$, is used to mitigate the biasing issues in the output sequence. In the embodiments of FIG. 5, the fast $RO_1$ is shared by an array of multiple chaotic systems to save power while improving throughput.

These various embodiments provide various advantages. Firstly, large or amplified jitter with minimum number of inverter stages reduces both power and area, and increases the randomness of the output stream. Secondly, dual sampling helps to mitigate biasing issues in the output sequence. Thirdly, low-power consumption is achieved since 1) the fast $RO_1$ is shared by the plurality of random number generators; 2) the high VDD ($V_{DDH}$) is used for the fast $RO_1$ while the rest of the random number generator 200, 400 or the system 500 use the low VDD ($V_{DDL}$); 3) the number of inverter stages in the slow ROs is small, and 4) the high jitter of the third oscillator $RO_{k2}$. Fourthly, the random number generator 200, 400 or the system 500 is scalable to different supply voltages and technologies due to all digital implementation.

In the following, simulation results of the random number generator 200 according to various embodiments above in a 65 nm CMOS process at two different operating conditions are discussed. According to the transient simulation of the third ring oscillator 213 at a supply voltage $V_{DDL}$ of 0.6V, the third ring oscillator 213 has the third frequency of 120 MHz with a jitter of almost 15% of its period. According to the transient simulation of the third ring oscillator 213 at a supply voltage $V_{DDL}$ of 1.2 V, the third ring oscillator 213 has the third frequency of 1 GHz and a jitter as large as 20% of its period. In these simulations, only the supply voltage is scaled while other conditions are kept the same. The simulation results shows that the random number generator 200 of the embodiments above offers very large jitter and is scalable with the supply voltage.

Further simulation results of the random number generator 200 show that the period of the output signal of the high frequency $RO_1$ 201 is about 1 ns. The jitter in the output signal of the third $RO_{12}$ 213 is as long as 1.8 ns, which is longer and larger than the period of the output signal of the high frequency $RO_1$ 201, and thus achieves high entropy.

Table 1 below shows the simulation results illustrating the performance of the random number generator 200 in 65 nm CMS process.

TABLE 1

| Tech-nology | Source of entropy | Bit rate (Mb/s) | Area (um²) | Power (uW) | Efficiency (pJ/bit) | Entropy | Normalized energy-area product |
|---|---|---|---|---|---|---|---|
| 65 nm | Oscillator Jitter | 120 scalable | 150 | 38 | 0.32 | 0.994 | 0.0045 |

The simulation results in Table 1 show that the random number generator 200 according to various embodiments provides a low energy-area product, which consumes low power and area while achieving high entropy and bit rate. It consumes only 38 μW power while having a throughput of 120 Mb/s. It also passed the NIST (National Institute of Standards and Technology) test suite when tested with 18 Mb.

According to various embodiments above, capacitive coupling between oscillators is provided as an effective and robust design to amplify jitter, which produces larger jitter over a range of frequencies and supply voltages. In this manner, noise is purposely injected from one RO to another and vice versa, causing them tangling with each other to result in the unpredictability of the rising edge of the ROs. By body voltage jitter injection, large jitter at low voltages is produced. Randomness depends on the nondeterministic property of the jitter, and thus by injecting more jitter, randomness is improved. Further, by providing more jitter, the requirement on the frequency of the high frequency RO which dominates power consumption can be reduced, and thus power can be decreased. The random number generator with capacitive coupling is scalable and operable at low supply voltages, for example, is able to operate at sub-threshold region to reduce power. A lower power supply is used for low frequency ROs. This reduces power and area and increases jitter, compared to conventional way which obtains lower frequency by adding more buffer stages or using higher threshold/stacking devices.

The embodiments of FIGS. 4 and 5 use both D and DB signals from the high frequency RO, so that the bias of the output random data can be eliminated, i.e. balance the percentage of "1" and "0", without the need to calibrate the high frequency RO. At the same time, a higher bit rate can be achieved.

The embodiments of FIG. 5 with an architecture to share the high frequency RO among an array of chaotic systems help to improve throughput, and saves both area and power consumption. Accordingly, the costs in terms of power, area and circuit complexity are low.

The random number generator and the system of the above embodiments may be used in low-power and small area applications, such as portable devices and smart-cards. They may also be used in high performance and high speed applications, such as high speed cryptography, server, data center, simulations and statistical sampling.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A true random number generator, comprising:
a first ring oscillator having a first frequency;
a second ring oscillator having a second frequency, the second frequency being lower than the first frequency;
a third ring oscillator having a third frequency, the third frequency being lower than the second frequency;
a capacitor connected between the second ring oscillator and the third ring oscillator to provide a capacitive coupling therebetween;
a D-type flip-flop having a data input connected to an output of the first ring oscillator and having a clock input connected to an output of the third ring oscillator, wherein the D-type flip-flop is configured to generate an output signal representing a sequence of random numbers.

2. The true random number generator of claim 1, wherein the second ring oscillator and the third ring oscillator are capacitively coupled by the capacitor without a direct current path between the second ring oscillator and the third ring oscillator.

3. The true random number generator of claim 1, wherein the capacitor has a capacitance in the order of femtofarads.

4. The true random number generator of claim 1, wherein the capacitive coupling provided by the capacitor is configured to increase jitter in the output of the third ring oscillator.

5. The true random number generator of claim 1, wherein jitter in the output of the third ring oscillator is scalable with a supply voltage applied to the third ring oscillator.

6. The true random number generator of claim 1, wherein the output of the third ring oscillator comprises jitter larger than a period of the output of the first ring oscillator.

7. The true random number generator of claim 1, wherein
the first ring oscillator is configured to receive a first supply voltage, and
the second ring oscillator and the third ring oscillator are configured to receive a second supply voltage, the second supply voltage being lower than or equal to the first supply voltage.

8. The true random number generator of claim 1, further comprising a further D-type flip-flop generating a further output signal representing a further sequence of random numbers,
wherein the further D-type flip-flop has a data input connected to a further output of the first ring oscillator and has a clock input connected to a further output of the third ring oscillator,
wherein the further output of the first ring oscillator is complementary to the output of the first ring oscillator, and the further output of the third ring oscillator is from a different node of the third ring oscillator compared with the output of the third ring oscillator.

9. The true random number generator of claim 8, further comprising a XOR gate configured to combine the output signal of the D-type flip-flop and the further output signal of the further D-type flip-flop to generate a combined output signal.

10. A system for generating random numbers, comprising:
a first ring oscillator having a first frequency; and
a plurality of random number generators;
each random number generator comprising:
a respective second ring oscillator having a respective second frequency, the respective second frequency being lower than the first frequency;
a respective third ring oscillator having a respective third frequency, the respective third frequency being lower than the respective second frequency;
a respective capacitor connected between the respective second ring oscillator and the respective third ring oscillator to provide a capacitive coupling therebetween;
a respective first D-type flip-flop having a data input connected to a first output of the first ring oscillator and having a clock input connected to a first output of the respective third ring oscillator, and configured to generate a respective first output signal representing a respective first sequence of random numbers;
a respective second D-type flip-flop having a data input connected to a second output of the first ring oscillator and having a clock input connected to a second output of the respective third ring oscillator, and configured to generate a respective second output signal representing a respective second sequence of random numbers;
wherein the second output of the first ring oscillator is complementary to the first output of the first ring oscillator, wherein the first output and the second output of the third ring oscillator are output from different nodes of the third ring oscillator.

11. The system of claim 10, wherein the second ring oscillator and the third ring oscillator are capacitively coupled by the capacitor without a direct current path between the second ring oscillator and the third ring oscillator in each of the plurality of random number generators.

12. The system of claim 10, wherein the second ring oscillators in different random number generators have at least one of different transistor sizes or different number of inverter stages from each other.

13. The system of claim 10, wherein the third ring oscillators in different random number generators have at least one of different transistor sizes or different number of inverter stages from each other.

14. The system of claim 10, wherein the respective capacitor has a capacitance in the order of femtofarads.

15. The system of claim 10, wherein in each of the plurality of random number generators, the capacitive coupling provided by the capacitor is configured to increase jitter in the first output and the second output of the third ring oscillator.

16. The system of claim 10, wherein jitter in the first output and the second output of the respective third ring oscillator is scalable with a supply voltage applied to the respective third ring oscillator.

17. The system of claim 10, wherein the first output and the second output of the respective third ring oscillator comprise jitter larger than a period of the first output and the second output of the first ring oscillator.

18. The system of claim 10, wherein
the first ring oscillator is configured to receive a first supply voltage; and
the second ring oscillator and the third ring oscillator of each random number generator are configured to receive a second supply voltage, the second supply voltage being lower than or equal to the first supply voltage.

19. The system of claim 10, wherein each random number generator further comprises a respective XOR gate configured to combine the first output signal of the first D-type flip-flop and the second output signal of the second D-type flip-flop to generate a combined output signal of each random number generator.

* * * * *